United States Patent
Lee et al.

(10) Patent No.: US 9,461,548 B2
(45) Date of Patent: Oct. 4, 2016

(54) SWITCH CONTROL CIRCUIT, SWITCH CONTROL METHOD AND POWER SUPPLY DEVICE USING THE SAME

(71) Applicant: FAIRCHILD KOREA SEMICONDUCTOR LTD., Bucheon-si (KR)

(72) Inventors: Won-Tae Lee, Cheonan-si (KR); Kyung-Oun Jang, Bucheon-Si (KR); Sung-Won Yun, Seoul (KR); Min-Woo Lee, Bucheon-si (KR)

(73) Assignee: Fairchild Korea Semiconductor LTD. (KR)

(*) Notice: Subject to any disclaimer, the term of this patent is extended or adjusted under 35 U.S.C. 154(b) by 281 days.

(21) Appl. No.: 14/211,635

(22) Filed: Mar. 14, 2014

(65) Prior Publication Data

US 2014/0268925 A1    Sep. 18, 2014

(30) Foreign Application Priority Data

Mar. 15, 2013  (KR) .......................... 10-2013-0028202

(51) Int. Cl.
| | |
|---|---|
| H02M 1/32 | (2007.01) |
| H02M 3/335 | (2006.01) |
| H02M 1/00 | (2006.01) |
| G01R 31/02 | (2006.01) |

(52) U.S. Cl.
CPC ........ *H02M 3/33507* (2013.01); *G01R 31/025* (2013.01); *H02M 1/32* (2013.01); *H02M 2001/0009* (2013.01)

(58) Field of Classification Search
CPC ........ H02M 1/32; H02M 1/36; H02M 1/156; H02M 3/335; H02M 3/33507; H02M 2001/0009; G01R 31/025
See application file for complete search history.

(56) References Cited

U.S. PATENT DOCUMENTS

| | | | |
|---|---|---|---|
| 4,860,154 A | 8/1989 | Fazlollahi | |
| 5,404,094 A * | 4/1995 | Green .................... | H02M 3/156 323/282 |
| 6,125,046 A * | 9/2000 | Jang ........................ | H02M 1/36 363/21.15 |
| 7,760,520 B2 * | 7/2010 | Jang ........................ | H02M 1/32 363/21.18 |
| 2003/0174005 A1* | 9/2003 | Latham, II ............ | H02M 3/157 327/172 |
| 2010/0067152 A1* | 3/2010 | Nakahashi .............. | H02M 1/32 361/18 |
| 2010/0320989 A1 | 12/2010 | Chang et al. | |
| 2015/0168476 A1* | 6/2015 | Park ..................... | G01R 31/025 324/549 |

* cited by examiner

*Primary Examiner* — Matthew Nguyen
(74) *Attorney, Agent, or Firm* — Grossman Tucker Perreault & Pfleger PLLC

(57) ABSTRACT

Embodiment relates to a switch control circuit, a switch control method, and a power supply using the switch control circuit. The power supply supplies power to a load using an input voltage. The switch control circuit controls a switching operation of the power switch that controls the power supply. The switch control circuit detects a duty of the power switch using a signal for controlling the switching operation of the power switch, detects the load using the feedback voltage, and determines a short-circuit of the sense resistor according to the detected duty and the detected load.

20 Claims, 5 Drawing Sheets

ND METHOD AND POWER SUPPLY
SWITCH CONTROL CIRCUIT, SWITCH CONTROL METHOD AND POWER SUPPLY DEVICE USING THE SAME

CROSS-REFERENCE TO RELATED APPLICATION

This application claims priority to and the benefit of Korean Patent Application No. 10-2013-0028202 filed in the Korean Intellectual Property Office on Mar. 15, 2013, the entire contents of which are incorporated herein by reference.

BACKGROUND (a) Field

The invention relates to a switch controller, a switch control method, and a power supply using the switch controller.

(b) Description of the Related Art

A power switch controlling an operation of a power supply is connected with a sense resistor that senses a drain current flowing to the power switch.

When the sense resistor is short-circuited, the power supply supplies power with the maximum duty to a load. When the power switch is operated with the maximum duty, the power switch may be damaged or the power supply may supply power that exceeds the load so that an abnormal operation may occur.

The above information disclosed in this Background section is only for enhancement of understanding of the background of the invention and therefore it may contain information that does not form the prior art that is already known in this country to a person of ordinary skill in the art.

SUMMARY

Embodiment has been made in an effort to provide a switch control circuit that can precisely determine a short-circuit state of a sense resistor, a switch control method, and a power supply using the switch control circuit.

A switch control circuit according to an exemplary embodiment controls a power switch that controls a power supply. The switch control circuit includes a power switch to control a power supply and a PWM controller to control a switching operation of the power switch using a sense voltage generated in a sense resistor to which a drain current flowing to the power switch flows and a feedback voltage corresponding to the output voltage, to detect a duty of the power switch and a load connected to the power supply, and to determine a short-circuit of the sense resistor according to the detected duty and the detected load.

The PWM controller includes a gate driver to generate a gate voltage for controlling the switching operation of the power switch, and detects the duty of the power switch using a PWM signal that controls an operation of the gate driver.

The PWM controller generates the PWM signal using a result of a comparison between the feedback voltage and the sense voltage and a clock signal determining a switching frequency.

The PWM controller includes: a comparator to receive the feedback voltage and the sense voltage and to generate a comparison signal according to a result of comparison between the two input voltages; an SR latch to increase an inverse output signal according to the comparison signal and decreasing the inverse output signal according to the clock signal; and a logic operation unit to generate the PWM signal according to the inverse output signal, the clock signal, and a protection signal generated when the sense resistor is short-circuited.

The logic operation unit is an NOR gate, and generates the PWM signal to turn on the power switch when all the inverse output signal, the clock signal, and the protection signal are low level.

The PWM controller includes a short-circuit detector to detect a load using the feedback voltage, and to determine the sense resistor to be short-circuited when the detected duty is higher than a predetermined threshold duty in a normal load condition during which the duty of the power switch does not exceed the predetermined threshold duty.

The short-circuit detector includes a duty detector to detect a duty by sensing a pulse with of the PWM signal and a load detector to detect a load by sensing the feedback voltage.

The duty detector compares the sensed pulse width of the PWM signal with a period corresponding to the predetermined threshold duty and generates a duty detection signal according to the comparison result, and the load detector compares the feedback voltage with a predetermined threshold feedback voltage and generates a load sense signal according to the comparison result.

The short-circuit detector further includes a logic operation unit to generate a short-circuit signal by performing a logic operation on the duty detection signal and the load sense signal, the switch control circuit further includes a protection circuit to generate a protection signal according to the short-circuit detection signal, and the switch control circuit stops a switching operation of the power switch when the protection signal is triggered and thus generated by the short-circuit detection signal.

The duty detector generates a first-level duty detection signal when the pulse width of the PWM signal sensed for each switching cycle exceeds the period that corresponds to the predetermined threshold duty.

After the duty detection signal is changed to the first level, the duty detector maintains the duty detection signal with the first level until before a pulse width of the PWM signal, sensed for each switching period is smaller than a period corresponding to the predetermined threshold duty.

The load detector generates a load sense signal of a second level when the feedback voltage is higher than the predetermined threshold feedback voltage, and generates a load sense signal of a third level when the feedback voltage is lower than the predetermined threshold feedback voltage.

The short-circuit detector further includes a logic operation unit to receive the duty detection signal of the first level and the load detection signal of the third level and to generate a short-circuit detection signal by performing an AND operation on the two inputs.

A switch control method according to an exemplary embodiment includes: inputting a sense voltage from a sense resistor to which a drain current of a power switch flows and a feedback voltage of a power supply controlled by the power switch; controlling a switching operation of the power switch by using the sense voltage and the feedback voltage; detecting a duty of the power switch by using a signal generated in the controlling the switching operation of the power switch; detecting a load connected to the power supply; and determining a short-circuit of the sense resistor according to the detected duty and the detected load.

The controlling the switching operation includes generating a PWM signal that turns on the power switch according to a clock signal that determines a switching frequency of the power switch and turns off the power switch according to a result of comparison between the sense voltage and the feedback voltage, and the signal generated in the controlling the switching operation of the power switch is the PWM signal.

The detecting the duty includes comparing a pulse width of the PWM signal and a period corresponding to a predetermined threshold duty, and the determining the short-circuit of the sense resistor includes determining a short-circuit of the sense resistor when the detected duty is higher than the predetermined threshold duty in a normal load condition during which a duty of the power switch does not exceed the predetermined threshold duty.

The detecting the load includes determining whether a load condition is a normal load condition during which a duty of the power switch does not exceeds a predetermined threshold duty according to a result of comparison between the feedback voltage and a predetermined threshold feedback voltage.

A power supply according to an exemplary embodiment supplies power to a load using an input voltage. The power supply includes: a switch control circuit to control a switching operation of a power switch that controls the power supply; a feedback circuit to generate a feedback voltage according to an output voltage connected to the load; and a sense resistor to which a drain current of the power switch flows.

The switch control circuit detects a duty of the power switch by using a signal for controlling a switching operation of the power switch, detects the load using the feedback voltage, and determining a short-circuit of the sense resistor according to the detected duty and the detected load.

The switch control circuit determines the sense resistor to be short-circuit when the detected duty is higher than a predetermined threshold duty in a normal load condition during which a duty of the power switch does not exceed the predetermined threshold duty.

According to exemplary embodiments of the t invention, a short-circuit of a sense resistor can be determined without directly sensing a sense voltage generated in the sense resistor. Accordingly, a noise component of the sense voltage does not influence determination of a short-circuit of the sense resistor.

Further, the short-circuit of the sense resistor is determined in consideration of a load condition, and therefore the short-circuit can be further precisely determined.

DETAILED DESCRIPTION OF THE EMBODIMENTS

Figure 1:
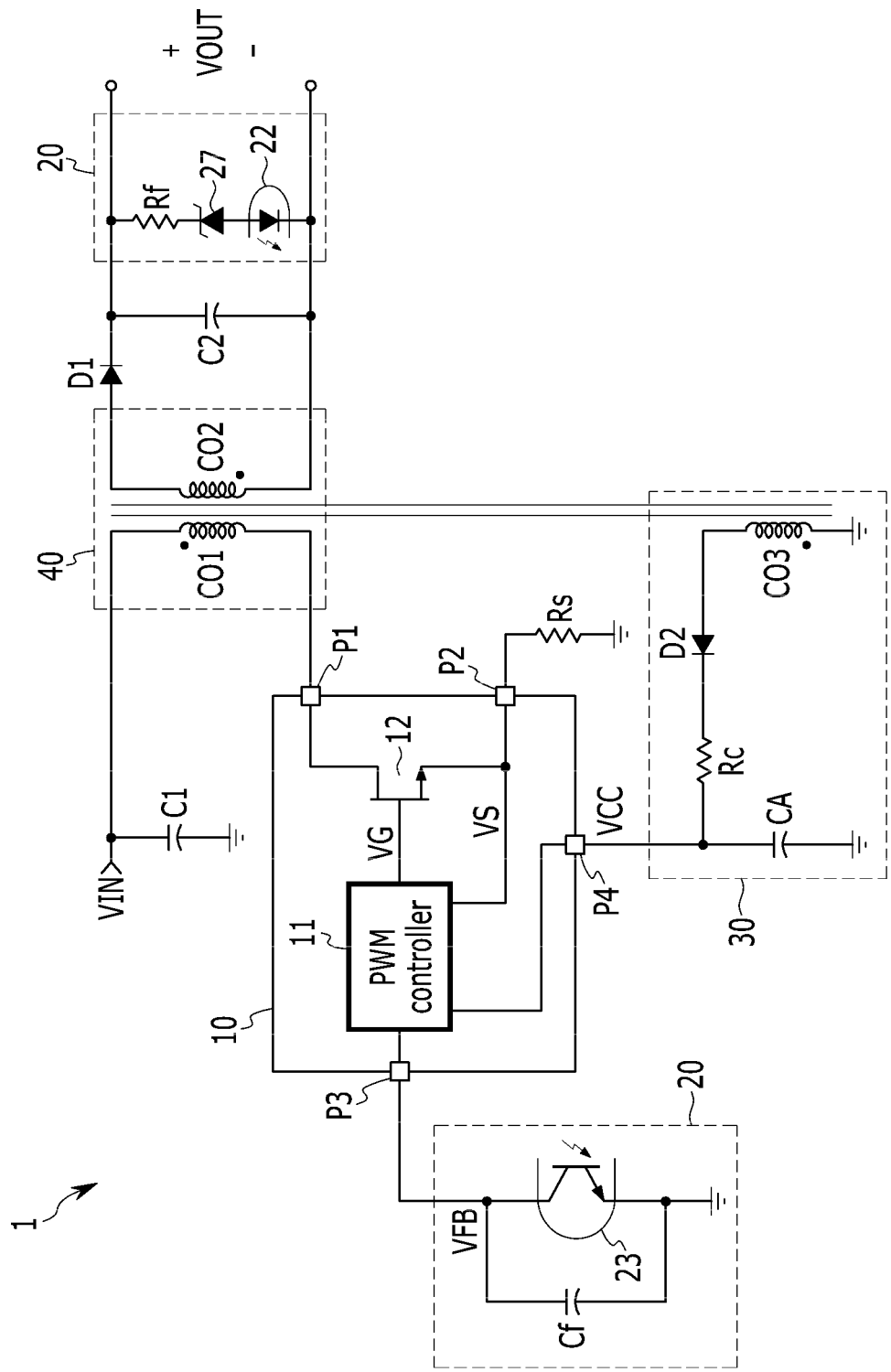
FIG. 1 shows a power supply according to an exemplary embodiment.

In the following detailed description, only certain exemplary embodiments have been shown and described, simply by way of illustration. As those skilled in the art would realize, the described embodiments may be modified in various different ways, all without departing from the spirit or scope of the invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a switch control circuit according to an exemplary embodiment, a method for driving the same, and a power supply including the switch control circuit will be described with reference to the accompanying drawings.

FIG. 1 shows a power supply according to an exemplary embodiment.

A power supply 1 supplies power to a load using an input voltage Vin. A voltage between two output terminals (+ and −) of the power supply 1 is referred to as an output voltage VOUT.

The power supply 1 includes a switch control circuit 10, a feedback circuit 20, a voltage generation circuit 30, a transformer 40, a DC-link capacitor C1, a rectification diode D1, and an output capacitor C2.

The DC-link capacitor C1 make an input voltage Vin smooth.

The transformer 40 transmits energy of a primary side to a secondary side. In the exemplary embodiment, the primary side is connected with the input voltage Vin and the secondary side is connected with the output terminals (+ and −).

The transformer 40 includes a primary side coil CO1 and a secondary side coil CO2. A first end of the primary side coil CO1 is connected to the input voltage Vin, and a second end of the primary side coil CO1 is connected to a drain of a power switch 12. A first end of the secondary side coil CO2 is connected to the output terminal (+) through the rectification diode D1 and a second end thereof is connected to the output terminal (−).

Energy is stored in the primary side coil CO1 during a turn-on period of the power switch 12, and the stored energy is transmitted to the secondary side coil CO2 during a turn-off period of the power switch 12. As described, the power supply 1 is controlled by a switching operation of the power switch 12.

That is, as the turn-on period of the power switch 12 is increased, the energy stored in the primary side coil CO1 is increased so that energy transmitted to the secondary side coil CO2 is increased. Accordingly, power supplied to the load is also increased. On the contrary, as the turn-on period of the power switch 12 is decreased (i.e., decrease of duty), the energy stored in the primary side coil CO1 is decreased so that energy transmitted to the secondary side coil CO2 is decreased. Accordingly, power supplied to the load is also decreased.

The power supply 1 controls the switching operation of the power switch 12 by using information on the output voltage VOUT that is changed according to the load. Here, the information means a feedback voltage.

A power supply may be realized as various types of converter. The power supply 1 according to the exemplary embodiment is realized as a fly-back converter among various types of converter, but the present invention is not limited thereto.

When a sense resistor Rs that senses a current flowing to the power switch 12 is connected with an IC where the switch control circuit 10 is implemented through a pin (i.e., P2 in FIG. 1), a short-circuit may occur in the sense resistor Rs. When the sense resistor is provided in the IC, the sense resistor is formed on a layout of the IC so that possibility in occurrence of the short-circuit of the sense resistor is low compared to the case that the sense resistor is provided in an external side of the IC.

The exemplary embodiment may be applied to a case that the sense resistor is provided in an external side of an IC where a switch control circuit is implement without regard to a type of a converter.

The rectification diode D1 rectifies a current flowing to the secondary side coil CO2. The rectified current is supplied to a load (not shown) connected with the output capacitor C2 and the output terminal.

The output capacitor C2 is connected between the output terminal (+) and the output terminal (−), and smooths a ripple of the output voltage VOUT.

The feedback circuit 20 generates a feedback voltage VFB corresponding to the output voltage VOUT. In the exemplary embodiment, the primary side and the secondary side are insulated from each other by the transformer 40, and thus the feedback circuit 20 includes an opto-coupler formed of an opto-diode 22 and an opto-transistor 23.

The feedback circuit 20 includes a resistor Rf, a shunt regulator 21, an opto-diode 22, an opto-transistor 23, and a capacitor Cf.

The resistor Rf, the shunt regulator 21, and the opto-diode 22 are connected in series between the output terminal (+) and the output terminal (−). A first end of the resistor Rf is connected to the output terminal (+), a cathode of the shunt regulator 21 is connected to a second end of the resistor Rf, and an anode of the shunt regulator 21 is connected to the opto-diode 22.

The shunt regulator 21 is biased when the output voltage VOUT exceeds a predetermined level, and maintains a voltage between the cathode and the anode to be constant. In this case, a current flowing through the regulator 21 is increased as the output voltage VOUT is increased, and the current flowing through the shunt regulator 21 is decreased as the output voltage VOUT is decreased.

The opto-diode 22 emits light according to the current transmitted through the shunt regulator 21. A current according to the amount of light emitted from the opto-transistor 23 flows to the opto-diode 22. Thus, the amount of light emitted from the opto-diode 22 is increased as the output voltage VOUT is increased so that a current flowing to the opto-transistor 23 is increased. On the contrary, the amount of light emitted from the opto-diode 22 is decreased as the output voltage VOUT is decreased so that the current flowing to the opto-transistor 23 is decreased.

The capacitor Cf is connected to lateral ends of the opto-transistor 23, and the feedback voltage VFB is generated in the capacitor Cf by the current flowing to the opto-transistor 23.

For example, the current supplied to the capacitor Cf from the switch control circuit 10 is decreased as the current flowing to the opto-transistor 23 is decreased so that the feedback voltage VFB is relatively decreased. On the contrary, the current supplied to the capacitor Cf from the switch control circuit 10 is increased as the current flowing to the opto-transistor 23 is decreased so that the feedback voltage VFB is relatively increased.

The voltage generation circuit 30 generates a power voltage VCC for operation of the switch control circuit 100 using an auxiliary coil CO3. When the rectification diode D1 is forward-biased and thus a current flows, a current flowing to the auxiliary coil CO3 charges the capacitor CA through the diode D2.

A first end of the auxiliary coil CO3 is connected to an anode of the diode D2 and a cathode of the diode D2 is connected to a first end of the capacitor CA through a resistor Rc. A second end of the auxiliary coil CO3 and a second end of the capacitor CA are connected to a primary side ground.

The switch control circuit 10 detects a duty of the power switch 12, recognizes the size of a load using the feedback voltage VFB, and determines a short-circuit of the sense resistor Rs according to the detected duty and the recognized size of the load.

The switch control circuit 10 is connected to the primary side coil CO1 through a pin P1, connected to the sense resistor Rs through a pin P2, connected to the feedback circuit 20 through a pin P3, and connected to the voltage generation circuit 30 through a pin P4.

The switch control circuit 10 includes the PWM controller 11 and the power switch 12.

The PWM controller 11 receives a sense voltage VS generated in the sense resistor Rs through the pin P2 and the feedback voltage VFB through the pin P3, determines a short-circuit of the sense resistor Rs, and generates a gate voltage VG that controls a switching operation of the power switch 12.

The PWM controller 11 detects a duty of the power switch 12, detects a load using the feedback voltage VFB, and determines whether the detected load is a normal load. The normal load implies a load when the duty of the power switch 12 does not exceed a predetermined threshold duty. The duty of the power switch 12 exceeds the predetermined threshold duty when the detected load exceeds the normal load, that is, when the detected load is a heavy load.

When a duty detected under a normal load condition exceeds the predetermined threshold duty, the PWM controller 11 determines that the sense resistor Rs is short-circuited.

The power voltage VCC supplies a voltage for operation of the switch control circuit 10. For example, the power voltage VCC supplies a voltage for operation of the PWM controller 11.

The power switch 12 is realized as an n-type transistor, a gate of the power switch 12 is supplied with the gate voltage VG, and a source of the power switch 12 is connected to the sense resistor Rs. During a turn-on period of the power switch 12, a drain current of the power switch 12 flows to the sense resistor Rs so that the sense voltage VS is generated.

Hereinafter, a switch control circuit 11 according to an exemplary embodiment will be described with reference to FIG. 1.

Figure 2:
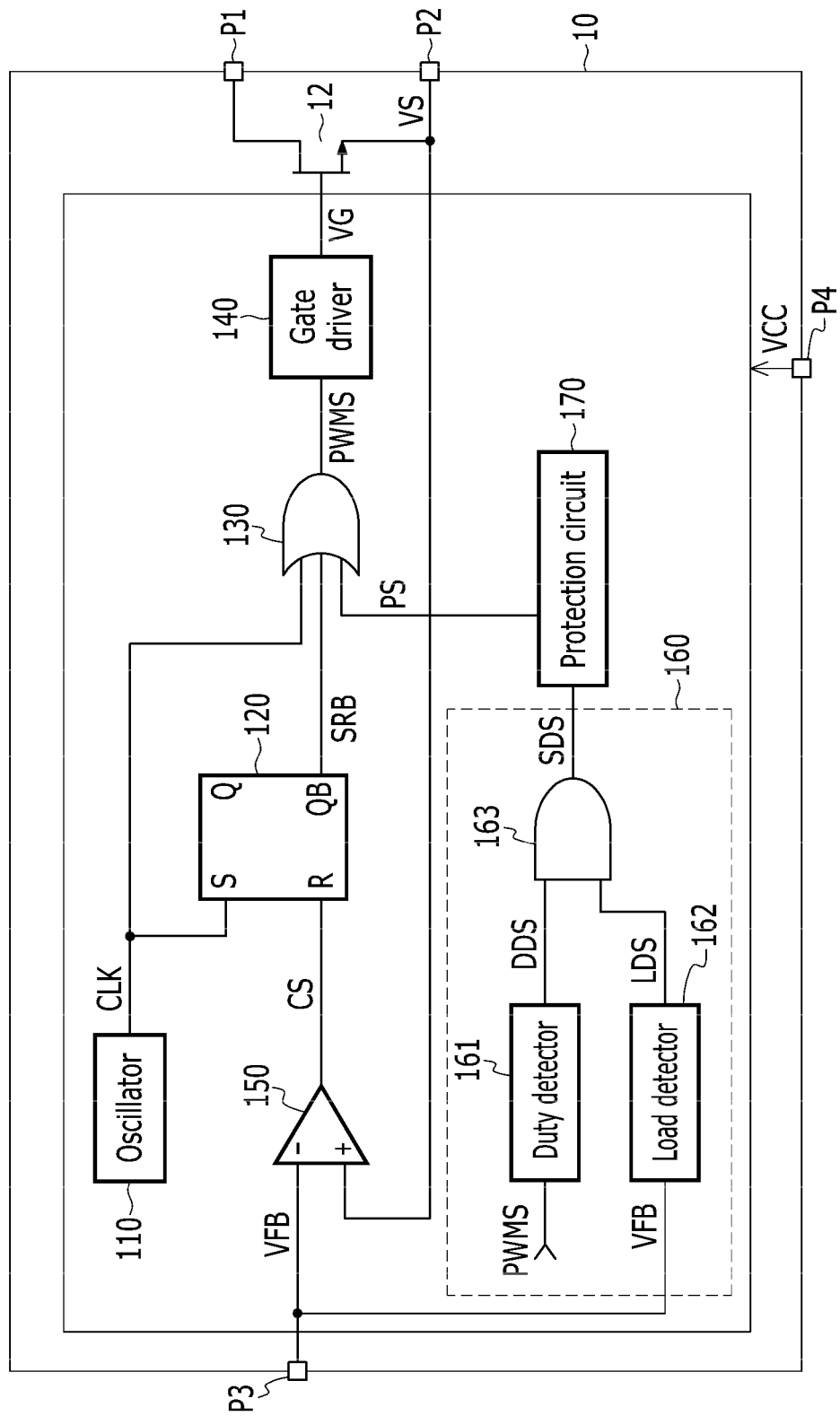
FIG. 2 shows a switch control circuit according to the exemplary embodiment.

FIG. 2 shows a switch control circuit according to an exemplary embodiment.

As shown in FIG. 2, the switch control circuit 11 includes an oscillator 110, an SR latch 120, a logical operation unit 130, a gate driver 140, a comparator 150, a short-circuit detector 160, and a protection circuit 170.

The oscillator 110 generates a clock signal CLK, and the clock signal CLK determines a switching frequency. For example, the power switch 12 may be turned on by being synchronized at a falling edge of the clock signal CLK.

The comparator 150 receives a sense voltage VS and a feedback voltage VFB, and generates a comparison signal CS according to a comparison result. The feedback voltage VFB is input to an inverse terminal (−) of the comparator 150 and the sense voltage VS is input to a non-inverse terminal (+).

The sense voltage VS has a waveform that is increased during the turn-on period of the power switch 12, and therefore the comparator 150 is synchronized at a time that the sense voltage VS reaches the feedback voltage VFB and generates a comparison signal CS of a high-level pulse. When the comparison signal CS of a high-level pulse is generated, the power switch 12 is turned off and thus no more sense voltage VS is generated.

The SR latch 120 generates an inverse output signal SRB according to an input of a set terminal S and an input of a reset terminal R. Since the inverse output signal SRB is a signal of an inverse output of the SR latch 120, the inverse output signal SRB is increased to high level according to the input of the reset terminal R and decreased to low level according to the input of the set terminal S. For example, when the comparison signal CS which is the input of the reset terminal R is a high level pulse, the SR latch 120 increases the inverse output signal SRB to high level and decreases the inverse output signal SRB to low level when the clock signal CLK is high level.

The logical operation unit 130 receives the clock signal CLK, the inverse output signal SRB, and a protection signal PS, and generates a PWM signal PWMS for controlling the gate driver 140 according to the three input signals.

For example, the logical operation unit 130 generates a high-level PWM signal PWMS when all the three input signals are low level, and generates a low-level PWM signal PWMS when at least one of the three input signals is high level.

The gate driver 140 receives the PWM signal PWMS and generates a gate voltage VS according to the PWM signal PWMS. For example, when the PWM signal PWMS is high level, the gate driver 140 generates a gate voltage VG having a level (i.e., high level) that turns on the power switch 12, and when the PWM signal PWMS is low level, the gate driver 140 generates a gate voltage VG having a level (i.e., low level) that turns off the power switch 12.

When an abnormal state is sensed, the protection circuit 170 generates a protection signal PS for stopping the switching operation of the power supply 1. For example, the protection circuit 170 receives a short-circuit detection signal SDS, and generates a high-level protection signal PS by being triggered when the short-circuit detection signal SDS has a level that enables a protection operation.

Then, the logical operation unit 130 generates a low-level PWM signal PWMS and thus the switch operation of the power switch 12 is stopped.

The short-circuit detector 160 detects a duty using the PWM signal PWMS, detects a load using the feedback voltage VFB, and determines a short-circuit of the sense resistor Rs according to the detected duty and the detected load.

The short-circuit detector 160 includes a duty detector 161, a load detector 162, and a logical operation unit 163.

The duty detector 161 receives the PWM signal PWMS, and detects a duty by sensing a pulse width of the PWM signal PWMS. The duty detector 161 compares the pulse width of the PWM signal PWMS and a period corresponding to the predetermined threshold duty, and generates a duty detection signal DDS according to a comparison result.

For example, the duty detector 161 generates a high-level duty detection signal DDS when a pulse width of the PWM signal PWMS, sensed for every switching cycle exceeds the period corresponding to the predetermined threshold duty. After the duty detection signal DDS is increased to high level, the duty detector 161 maintains the high-level duty detection signal DDS until before the pulse width of the PWM signal PWMS, sensed for every switching cycle is smaller than the period corresponding to the predetermined threshold duty.

The load detector 162 receives the feedback voltage VFB, and detects a load by sensing the feedback voltage VFB. The load detector 162 compares the feedback voltage VFB and a predetermined threshold feedback voltage, and generates a load detection signal LDS according to a comparison result.

For example, the load detector 162 generates a low-level load detection signal LDS when the feedback voltage VFB is higher than the predetermined threshold feedback voltage. When the feedback voltage VFB is lower than the predetermined threshold feedback voltage, the load detector 162 generates a high-level load sense signal LDS.

The logical operation unit 163 receives the duty detection signal DDS and the load detection signal LDS, and generates a short-circuit detection signal SDS according to the two inputs. For example, the logical operation unit 163 is realized as an AND gate performing an AND operation, and generates a high-level short-circuit direction signal SDS that indicates a short-circuit when both of the duty detection signal DDS and the load detection signal LDS are high level.

Hereinafter, a short-circuit detection operation according to an exemplary embodiment will be described with reference to FIG. 3.

Figure 3:
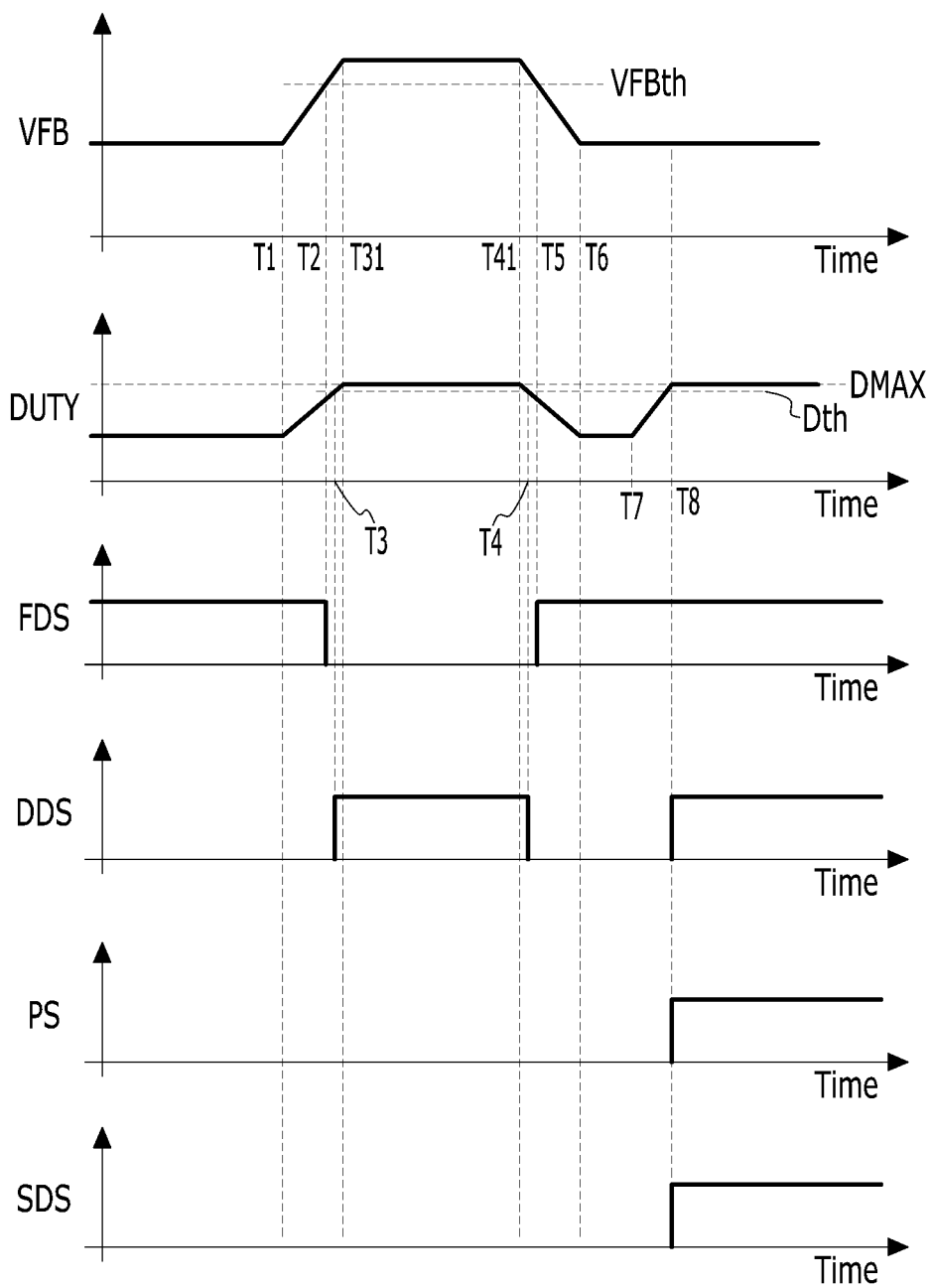
FIG. 3 is a waveform diagram of a feedback voltage, a duty, a duty detection signal, a load detection signal, and a protection signal according to an exemplary embodiment.

FIG. 3 is a waveform diagram of a feedback voltage, a duty, a duty detection signal, a load detection signal, and a protection signal according to the exemplary embodiment.

As shown in FIG. 3, when a load starts to increase from a time T1, a feedback voltage VFB also starts to increase. According to the exemplary embodiment, an output voltage VOUT is decreased as the load is increased so that the feedback voltage VFB is increased. A duty is also increased according to the increase of the load.

At a time T2, the feedback voltage VFB reaches the predetermined threshold feedback voltage VFBth and a load detection signal FDS becomes low level. At a time T3, the increasing duty reaches the predetermined threshold duty Dth and the duty detection signal DDS is increased to high level.

The increasing duty reaches the maximum duty DMAX at the time T3 and thus is not further increased. The feedback voltage VFB is maintained with a constant level according to a difference between power according to the maximum duty DMAX and power that the load requires.

From a time T41, the load starts to decrease, and the feedback voltage VFB and the duty also decrease. At a time T4 at which the decreasing duty becomes lower than the predetermined threshold duty Dth, the duty detection signal DDS is decreased to low level. At a time T5 at which the decreasing feedback voltage VFB becomes lower than the predetermined threshold feedback voltage VFBth, the load detection signal FDS is increased to high level.

As described, the increase of duty according to the increase of the load is irrelevant to a short-circuit of the sense resistor, and therefore the short-circuit detection signal SDS is not increased to a level that indicates high-level, that is, detection of short-circuit although the duty to exceed the predetermined threshold duty Dth.

The load started to decrease from the time T41 is maintained with a normal load from a time T6. In a normal load condition, the duty starts to increase from a time T7, and when the duty reaches the predetermined threshold duty Dth at a time T8, the duty detection signal DDS is increased to high level. In this case, the load detection signal FDS is high level, and therefore the logical operation unit 163 generates a high level short-circuit detection signal SDS.

The protection circuit 170 generates a protection signal PS that stops the switching operation according to the high-level short-circuit detection signal SDS.

Hereinafter, an operation of the power supply according to the exemplary embodiment will be described with reference to FIG. 4.

Figure 4:
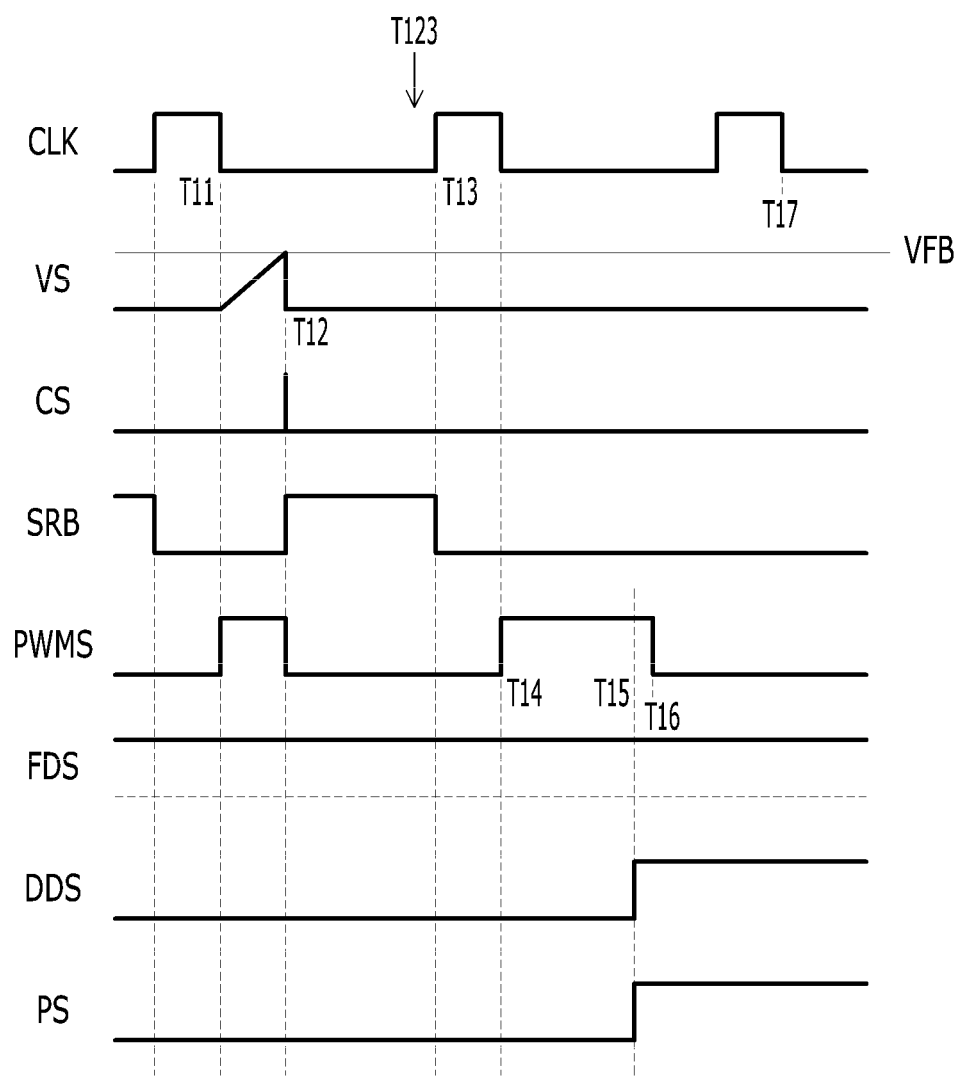
FIG. 4 is a waveform diagram of a clock signal, a feedback voltage, a sense voltage, a comparison signal, an inverse output signal, a PWM signal, a load detection signal, a duty detection signal, and a protection signal according to an exemplary embodiment.

FIG. 4 is a waveform diagram of a clock signal, a feedback signal, a feedback voltage, a sense voltage, a comparison signal, an inverse output signal, a PWM signal, a load detection signal, a duty detection signal, and a protection signal according to the exemplary embodiment. FIG. 4 shows signals generated in a normal load condition.

At a time T11, a clock signal CLK is decreased to low level. All the clock signal CLK, an inverse output signal SRB, and a protection signal PS input to a logical operation unit 130 are low level, and therefore a PWM signal PWMS is increased to high level.

The power switch 12 is turned on according to the PWM signal PWMS and thus a drain current flows and a sense voltage VS starts to increase from a time T11. At a time T12 at which the increasing sense voltage VS reaches the feedback voltage VFB, a comparison signal CS of a high-level pulse is generated. The comparison signal CS of the high-level pulse is input to a reset terminal R of an SR latch 120, and the SR latch 120 generates a high-level inverse output signal SRB.

Then, at a time T12, the logical operation unit 130 generates a low-level PWM signal PWMS by the high-level inverse output signal SRB, and the power switch 120 is turned off. Since the power switch 12 is turned off, the drain current does not flow, and therefore no sense voltage VS is generated and the comparison signal CS is decreased to low level.

At a time T13, the clock signal CLK is increased to high level, a high-level clock signal CLK is input to a set terminal of the SR latch 120, and the SR latch 120 generates a low-level inverse output signal SRB. It is assumed that a sense resistor Rs is short-circuit at a time T123 which is a random time point between the time T12 and the time T13.

When the clock signal CLK is decreased to low level at a time T14, the PWM signal PWMS is increased to high level and the power switch 12 is turned on so that the drain current flows to the sense resistor Rs. However, when the sense resistor Rs is short-circuited, the sense resistor Rs is too low so that the sense voltage VS is substantially not generated. Accordingly, the sense voltage VS cannot reaches the feedback voltage VFB, and the duty of the power switch 12 is controlled to the maximum duty DMAX.

In FIG. 4, a period T14 to T16 corresponds to a period corresponding to the maximum duty, and a period T14 to T15 is a period corresponding to the predetermined threshold duty Dth.

That is, the power switch 12 is turned on during the period T14 to T16 according to the maximum duty DMAX, and the duty detection signal DDS is increased to high level at a time T15 at which the duty of the power switch 12 reaches the predetermined threshold duty Dth. As previously stated, FIG. 4 is a waveform diagram according to a normal load condition, and therefore the load detection signal FDS is maintained with high level. Therefore, at the time T15, the protection signal PS is increased to high level. Then, the logical operation unit 130 generates a low-level PWM signal PWMS. Such a PWM signal PWMS is maintained with low level unless the protection signal PS is reset to low level.

Figure 5:
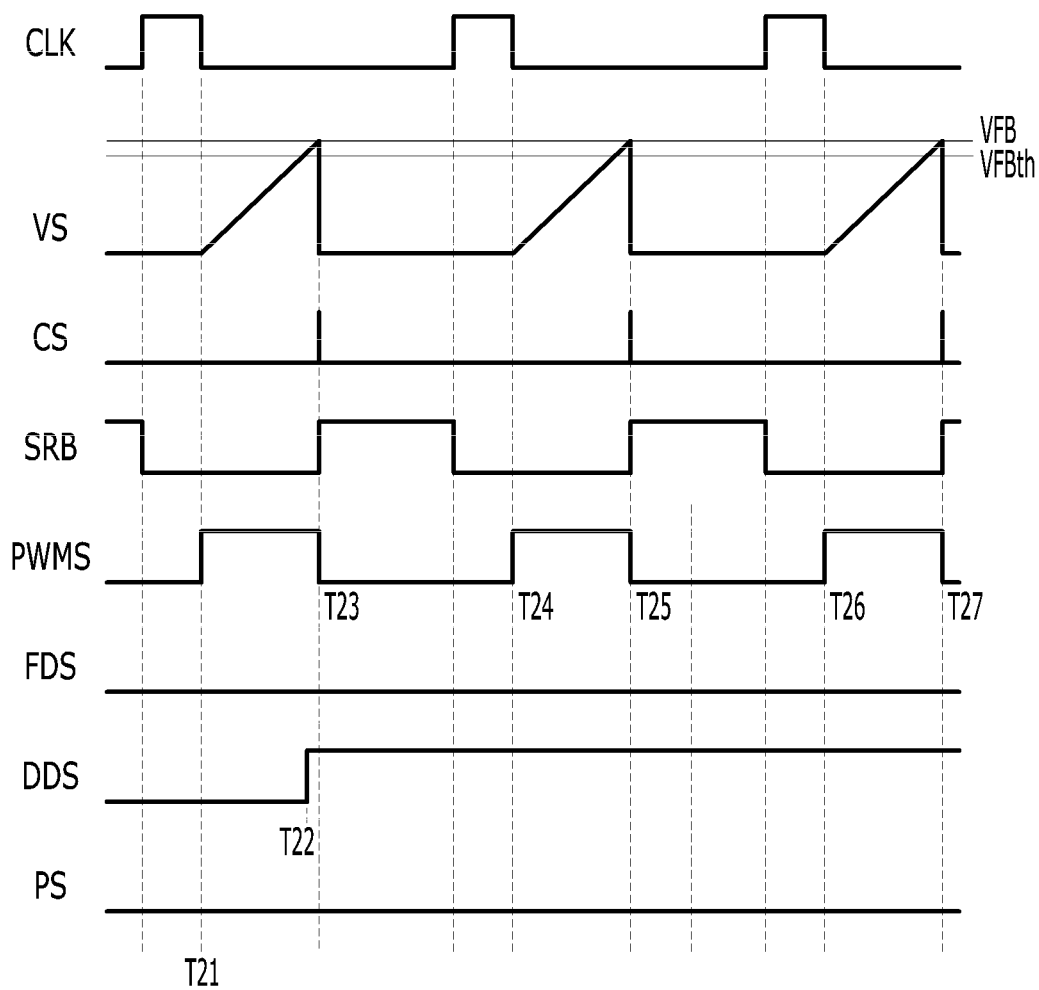
FIG. 5 is a waveform diagram of a clock signal, a feedback voltage, a sense voltage, a comparison signal, an inverse output signal, a PWM signal, a load detection signal, a duty detection signal, and a protection signal according to an exemplary embodiment.

FIG. 5 is a waveform diagram of a clock signal, a feedback voltage, a sense voltage, a comparison signal, an inverse output signal, a PWM signal, a load detection signal, a duty detection signal, and a protection signal according to the exemplary embodiment. FIG. 5 shows signals generated in an abnormal load condition, that is, a heavy load condition.

At a time T21, the clock signal CLK is decreased to low level. Since all the clock signal CLK, the inverse output signal SRB, and the protection signal PS input to the logical operation unit 130 are low level, the PWM signal PWMS is increased to high level.

The power switch 12 is turned on according to the PWM signal PWMS so that the drain current flows and the sense voltage VS starts to increase from the time T21. At a time T23 at which the increasing sense voltage VS reaches the feedback voltage VFB, a comparison signal of a high-level pulse is generated. The comparison signal CS of the high-level pulse is input to the reset terminal R of the SR latch 120 and the SR latch 120 generates a high-level inverse output signal SRB.

Then, at the time T23, the logical operation unit 130 generates a low-level PWM signal PWMS by the high-level inverse output signal SRB, and the power switch 120 is turned off. Since no current flows due to turn-off of the power switch 12, no sense voltage VS is generated and the comparison signal CS is decreased to low level.

At a time T22, the duty of the power switch 12 reaches the predetermined threshold duty Dth so that the duty detection signal DDS is increased to high level. However, as shown in FIG. 5, the feedback voltage VFB is higher than the predetermined threshold feedback voltage VFBth, that is, a heavy load condition occurs, and therefore the load detection signal FDS is low level. Therefore, the protection signal PS is also maintained with low level rather than being increased to high level at the time T22.

As shown in FIG. 5, during the turn-on period of the power switch 12, a period T24 to T25 and a period T26 to T27 are longer than the turn-on period that corresponds to the predetermined threshold duty Dth. Therefore, the duty detection signal DDS is maintained with high level. However, the load detection signal FDS is maintained with low level in the heavy load condition, and therefore the protection signal PS is not increased to high level.

The exemplary embodiment that determines a short-circuit of the sense resistor using the sense voltage and the feedback voltage has been described. In the exemplary embodiment, the predetermined threshold duty is set to be a value lower by a predetermined margin than the maximum duty, but it is not restrictive. The margin is changeable according to a design condition.

Further, in the exemplary embodiment referring to FIG. 3 and FIG. 4, the sense resistor is determined to be short-circuited when the duty of the power switch first exceeds the predetermined threshold duty in a normal load condition, but the invention is not limited thereto. The short-circuit of the sense resistor may be determined when the number of times that the duty of the power switch exceeds the predetermined threshold duty is higher than a predetermined level.

The short-circuit of the sense resistor can be simply determined by detecting a duty that exceeds the predetermined threshold duty. Since the short-circuit of the sense resistor is not determined by directly sensing a sense voltage, a noise that may be generated in a pin connected with the sense resistor can be excluded. Further, a load is detected by using a feedback voltage, and therefore an occurrence of an abnormal operation that determines the sense resistor is short-circuit in a load condition that is heavier than a normal lead condition.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS power supply 1, switch control circuit 10, feedback circuit 20
voltage generation circuit 30, transformer 40,
capacitor C1, rectification diode D1, output capacitor C2
primary side coil CO1, secondary side coil CO2, resistor Rf
shunt regulator 21, opto-diode 22, opto-transistor 23
capacitor Cf, auxiliary coil CO3, diode D2
PWM controller 11, power switch 12, oscillator 110
SR latch 120, logical operation unit 130 and 163, gate driver 140
comparator 150, short-circuit detector 160, protection circuit 170
duty detector 161, load detector 162

What is claimed is:

1. A switch control circuit comprising:
    a power switch configured to control a power supply; and
    a PWM controller configured to control a switching operation of the power switch using a sense voltage generated in a sense resistor to which a drain current flowing to the power switch flows and a feedback voltage corresponding to the output voltage, to detect a duty of the power switch and a load connected to the power supply, and to determine a short-circuit of the sense resistor according to the detected duty and the detected load.

2. The switch control circuit of claim 1, wherein the PWM controller comprises:
    a gate driver configured to generate a gate voltage for controlling the switching operation of the power switch, and to detect the duty of the power switch using a PWM signal that controls an operation of the gate driver.

3. The switch control circuit of claim 2, wherein the PWM controller generates the PWM signal using a result of a comparison between the feedback voltage and the sense voltage and a clock signal determining a switching frequency.

4. The switch control circuit of claim 3, wherein the PWM controller further comprises:
    a comparator configured to receive the feedback voltage and the sense voltage and to generate a comparison signal according to a result of comparison between the two input voltages;
    an SR latch configured to increase an inverse output signal according the comparison signal and to decrease the inverse output signal according to the clock signal; and
    a logic operation unit configured to generate the PWM signal according to the inverse output signal, the clock signal, and a protection signal generated when the sense resistor is short-circuited.

5. The switch control circuit of claim 4, wherein the logic operation unit is an NOR gate, and is configured to generate the PWM signal to turn on the power switch when all the inverse output signal, the clock signal, and the protection signal are low level.

6. The switch control circuit of claim 1, wherein the PWM controller comprises:
    a short-circuit detector configured to detect a load using the feedback voltage, and to determine the sense resistor to be short-circuited when the detected duty is higher than a predetermined threshold duty in a normal load condition during which the duty of the power switch does not exceed the predetermined threshold duty.

7. The switch control circuit of claim 6, wherein the short-circuit detector comprises:
    a duty detector configured to detect a duty by sensing a pulse width of the PWM signal; and
    a load detector configured to detect a load by sensing the feedback voltage.

8. The switch control circuit of claim 7, wherein the duty detector is configured to compare the sensed pulse width of the PWM signal with a period corresponding to the predetermined threshold duty and to generate a duty detection signal according to the comparison result, and
    the load detector is configured to compare the feedback voltage with a predetermined threshold feedback voltage and to generate a load sense signal according to the comparison result.

9. The switch control circuit of claim 8, wherein the short-circuit detector further comprises a logic operation unit configured to generate a short-circuit signal by performing a logic operation on the duty detection signal and the load sense signal,
    the switch control circuit further comprises a protection circuit configured to generate a protection signal according to the short-circuit detection signal, and
    the switch control circuit is configured to stop a switching operation of the power switch when the protection signal is triggered and thus generated by the short-circuit detection signal.

10. The switch control circuit of claim 8, wherein the duty detector is configured to generate a first-level duty detection signal when the pulse width of the PWM signal sensed for each switching cycle exceeds the period that corresponds to the predetermined threshold duty.

11. The switch control circuit of claim 10, wherein, after the duty detection signal is changed to the first level, the duty detector is configured to maintain the duty detection signal with the first level until before a pulse width of the PWM signal, sensed for each switching period, is smaller than a period corresponding to the predetermined threshold duty.

12. The switch control circuit of claim 11, wherein the load detector is configured to generate a load sense signal of a second level when the feedback voltage is higher than the predetermined threshold feedback voltage, and to generate a load sense signal of a third level when the feedback voltage is lower than the predetermined threshold feedback voltage.

13. The switch control circuit of claim 12, wherein the short-circuit detector further comprises a logic operation unit configured to receive the duty detection signal of the first level and the load detection signal of the third level and to generate a short-circuit detection signal by performing an AND operation on the two inputs.

14. A switch control method comprising:
  inputting a sense voltage from a sense resistor to which a drain current of a power switch flows and a feedback voltage of a power supply controlled by the power switch;
  controlling a switching operation of the power switch by using the sense voltage and the feedback voltage;
  detecting a duty of the power switch by using a signal generated in the controlling the switching operation of the power switch;
  detecting a load connected to the power supply; and
  determining a short-circuit of the sense resistor according to the detected duty and the detected load.

15. The switch control method of claim 14, wherein the controlling the switching operation comprises generating a PWM signal that turns on the power switch according to a clock signal that determines a switching frequency of the power switch and turns off the power switch according to a result of comparison between the sense voltage and the feedback voltage, and the signal generated in the controlling the switching operation of the power switch is the PWM signal.

16. The switch control method of claim 15, wherein the detecting the duty comprises comparing a pulse width of the PWM signal and a period corresponding to a predetermined threshold duty, and
  the determining the short-circuit of the sense resistor comprises determining a short-circuit of the sense resistor when the detected duty is higher than the predetermined threshold duty in a normal load condition during which a duty of the power switch does not exceed the predetermined threshold duty.

17. The switch control method of claim 14, wherein the detecting the load comprises determining whether a load condition is a normal load condition during which a duty of the power switch does not exceeds a predetermined threshold duty according to a result of comparison between the feedback voltage and a predetermined threshold feedback voltage.

18. A power supply supplying power to a load using an input voltage, the power supply comprising:
  a switch control circuit configured to control a switching operation of a power switch that controls the power supply;
  a feedback circuit configured to generate a feedback voltage according to an output voltage connected to the load; and
  a sense resistor configured to which a drain current of the power switch flows,
  wherein the switch control circuit is configured to detect a duty of the power switch by using a signal for controlling a switching operation of the power switch, configured to detect the load using the feedback voltage, and configured to determine a short-circuit of the sense resistor according to the detected duty and the detected load.

19. The power supply of claim 18, wherein the switch control circuit determines the sense resistor to be short-circuit when the detected duty is higher than a predetermined threshold duty in a normal load condition during which a duty of the power switch does not exceed the predetermined threshold duty.

20. The power supply of claim 18, wherein the switch control circuit compares the feedback voltage and a predetermined threshold feedback voltage and generates a load sense signal according to a result of the comparison.

* * * * *